(12) United States Patent
Lee et al.

(10) Patent No.: US 11,276,839 B2
(45) Date of Patent: Mar. 15, 2022

(54) ORGANIC LIGHT-EMITTING DISPLAY APPARATUS

(71) Applicant: SAMSUNG DISPLAY CO., LTD., Yongin-si (KR)

(72) Inventors: Jieun Lee, Yongin-si (KR); Wonkyu Kwak, Yongin-si (KR); Kwangmin Kim, Yongin-si (KR); Kiwook Kim, Yongin-si (KR); Dongsoo Kim, Yongin-si (KR); Joongsoo Moon, Yongin-si (KR); Hyunae Park, Yongin-si (KR); Changkyu Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 10 days.

(21) Appl. No.: 16/992,738

(22) Filed: Aug. 13, 2020

(65) Prior Publication Data

US 2020/0373518 A1 Nov. 26, 2020

Related U.S. Application Data

(62) Division of application No. 15/937,305, filed on Mar. 27, 2018, now Pat. No. 10,770,681.

(30) Foreign Application Priority Data

Mar. 31, 2017 (KR) .......................... 10-2017-0041392

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3276* (2013.01);
(Continued)

(58) Field of Classification Search
CPC ............ H01L 51/5253; H01L 51/5209; H01L 51/5225; H01L 51/5246
See application file for complete search history.

(56) References Cited

U.S. PATENT DOCUMENTS

| 8,222,809 B2 | 7/2012 | Lee et al. |
| 9,343,518 B2 | 5/2016 | Han |

(Continued)

FOREIGN PATENT DOCUMENTS

| KR | 10-2007-0047978 | 5/2007 |
| KR | 10-2014-0033867 | 3/2014 |

(Continued)

*Primary Examiner* — Douglas M Menz
(74) *Attorney, Agent, or Firm* — F. Chau & Associates, LLC

(57) ABSTRACT

An organic light-emitting display apparatus includes a substrate having a display area displaying an image and a periphery area. The periphery area is located next to the display area. A first organic insulating layer is disposed on the substrate. The first organic insulating layer includes a valley portion separating the first organic insulating layer from the periphery area. A plurality of organic light-emitting devices is disposed on the substrate. Each of the organic light-emitting devices includes a first electrode, an emission layer, and a second electrode, sequentially disposed over the first organic insulating layer. The second electrode covers the emission layer and the valley portion. A second organic insulating layer is disposed over the first organic insulating layer and incudes a first opening exposing a center portion of the first electrode and a second opening overlapping the valley portion. A capping layer covers the second electrode.

5 Claims, 9 Drawing Sheets

(52) U.S. Cl.
CPC ...... *H01L 51/5209* (2013.01); *H01L 51/5225* (2013.01); *H01L 51/5246* (2013.01)

(56) References Cited

U.S. PATENT DOCUMENTS

| | | | |
|---|---|---|---|
| 9,356,085 | B2 | 5/2016 | Kim |
| 9,412,972 | B2 | 8/2016 | Shim et al. |
| 10,720,596 | B2 | 7/2020 | Cho et al. |
| 2005/0218396 | A1 | 10/2005 | Tsuchiya et al. |
| 2017/0069873 | A1* | 3/2017 | Kim ...................... H01L 51/525 |
| 2017/0098795 | A1 | 4/2017 | Kim |
| 2017/0279079 | A1 | 9/2017 | Kim et al. |
| 2017/0287995 | A1* | 10/2017 | Kim ...................... H01L 51/5253 |
| 2017/0331058 | A1* | 11/2017 | Seo ...................... H01L 51/5293 |
| 2017/0365814 | A1* | 12/2017 | Kim ...................... H01L 51/5246 |
| 2018/0005568 | A1* | 1/2018 | Kim ........................ H01L 51/50 |
| 2018/0032189 | A1* | 2/2018 | Lee ........................ G06F 3/0443 |
| 2018/0097034 | A1* | 4/2018 | Lee ...................... H01L 23/3142 |
| 2018/0113545 | A1* | 4/2018 | Shim ................ G02F 1/133345 |
| 2018/0159077 | A1* | 6/2018 | Lee ...................... H01L 51/5253 |
| 2018/0226612 | A1* | 8/2018 | Choi .................... H01L 27/3246 |
| 2018/0287093 | A1 | 10/2018 | Lee et al. |

FOREIGN PATENT DOCUMENTS

| | | |
|---|---|---|
| KR | 10-2015-0016784 | 2/2015 |
| KR | 10-2015-0094950 | 8/2015 |
| KR | 10-2015-0141274 | 12/2015 |
| KR | 10-2016-0032800 | 3/2016 |
| KR | 10-2017-0113764 | 10/2017 |

\* cited by examiner

ORGANIC LIGHT-EMITTING DISPLAY APPARATUS

CROSS-REFERENCE TO RELATED APPLICATION

This application is a Division of co-pending U.S. patent application Ser. No. 15/937,305, filed on Mar. 27, 2018, which claims priority to and the benefit of Korean Patent Application No. 10-2017-0041392, filed on Mar. 31, 2017, in the Korean intellectual Property Office, the disclosures of which are incorporated by reference herein in their entirety.

TECHNICAL FIELD

The present disclosure relates to a display apparatus, and more particularly, to an organic light-emitting display apparatus.

DISCUSSION OF THE RELATED ART

An organic light-emitting display apparatus includes an organic light-emitting diode (OLED) device including a hole injection electrode, an electron injection electrode, and an organic emission layer disposed between the hole injection electrode and the electron injection electrode. The organic light-emitting display apparatus is a self-emitting type display apparatus that generates light as it displays an image. In the OLEDs, light is generated as holes, injected from the hole injection electrode, and electrons, injected from the electron injection electrode, combine in the organic emission layer.

Since the organic light-emitting display apparatus does not need a separate light source to display an image, the organic light-emitting display apparatus may be driven at a low voltage, may be light-weight and thin, may have an excellent viewing angle, may have a high contrast ratio, and may have a high response speed. Thus, the organic light-emitting display apparatus may be used in all manner of personal portable devices (e.g. MP3 players and mobile phones) as well as larger electronic devices such as televisions (TV) and computer monitors.

However, the image quality of OLED display devices may deteriorate as a result of manufacture or during subsequent use as impurities, such as a gas or moisture, introduced from an outside source or generated from an organic material included in the organic light-emitting display apparatus, infiltrate into an organic light-emitting device.

SUMMARY

An organic light-emitting display apparatus includes a substrate having a display area, within which an image is displayed, and a periphery area, within which no image is displayed. The periphery area is located next to or surrounding the display area. A first organic insulating layer is disposed on the substrate within the display area and the periphery area. The first organic insulating layer includes a valley portion separating the first organic insulating layer from the periphery area. A plurality of organic light-emitting devices is disposed on the substrate. Each of the plurality of organic light-emitting devices includes, in the display area, a first electrode, an emission layer, and a second electrode, which are sequentially disposed over the first organic insulating layer. The second electrode covers the emission layer and the valley portion. A second organic insulating layer is disposed over the first organic insulating layer in the display area and the periphery area, and incudes a first opening exposing a center portion of the first electrode and a second opening overlapping the valley portion. A capping layer covers the second electrode.

An organic light-emitting display apparatus includes a substrates having a display area, within which an image is displayed using a plurality of organic light-emitting devices. A valley portion is disposed on the substrate outside of the display area. The valley portion separates a region of an organic insulating layer. A power supply line is disposed on the substrate outside of the display area and supplies power to the plurality of organic light-emitting devices. A dam portion is disposed on the substrate outside of the display area. A common electrode of the plurality of organic light-emitting devices, covers the display area and the valley portion, and contacts the power supply line. A capping layer covers the common electrode. An encapsulation member is disposed over the capping layer and incudes at least one organic film and at least one inorganic film.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
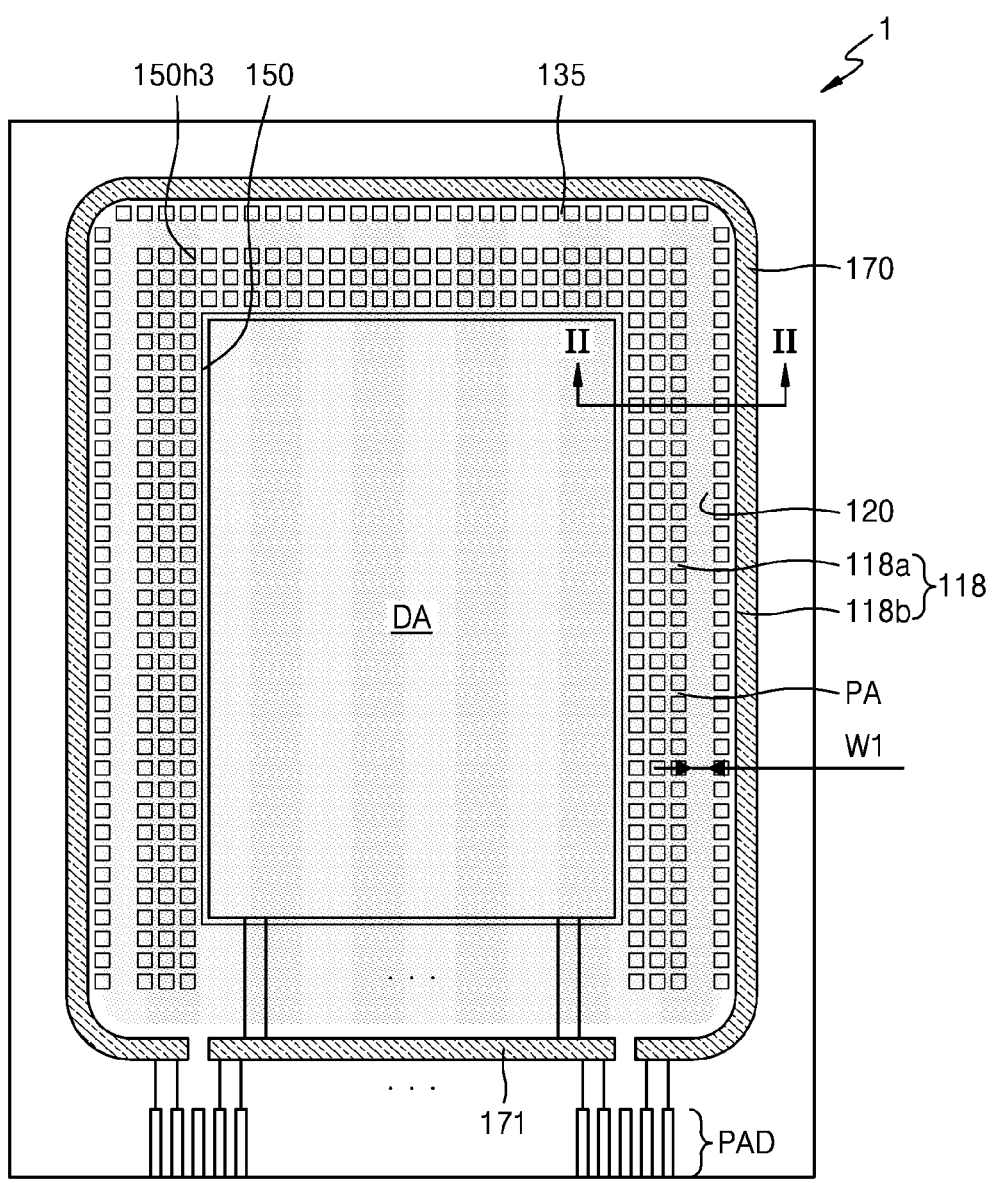
FIG. 1 is a schematic plan view illustrating a part of an organic light-emitting display apparatus, according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In drawings, like reference numerals may refer to like elements. It may be assumed that where detailed description of an element is not provided, that element may be similar to or identical to corresponding elements described elsewhere in the disclosure.

It will be understood that when a component or layer is referred to as being "on" another component or layer, the component or layer can be directly on another component or layer or intervening component or layers. In drawings, for convenience of description, sizes of components may be exaggerated for clarity.

Figure 2:
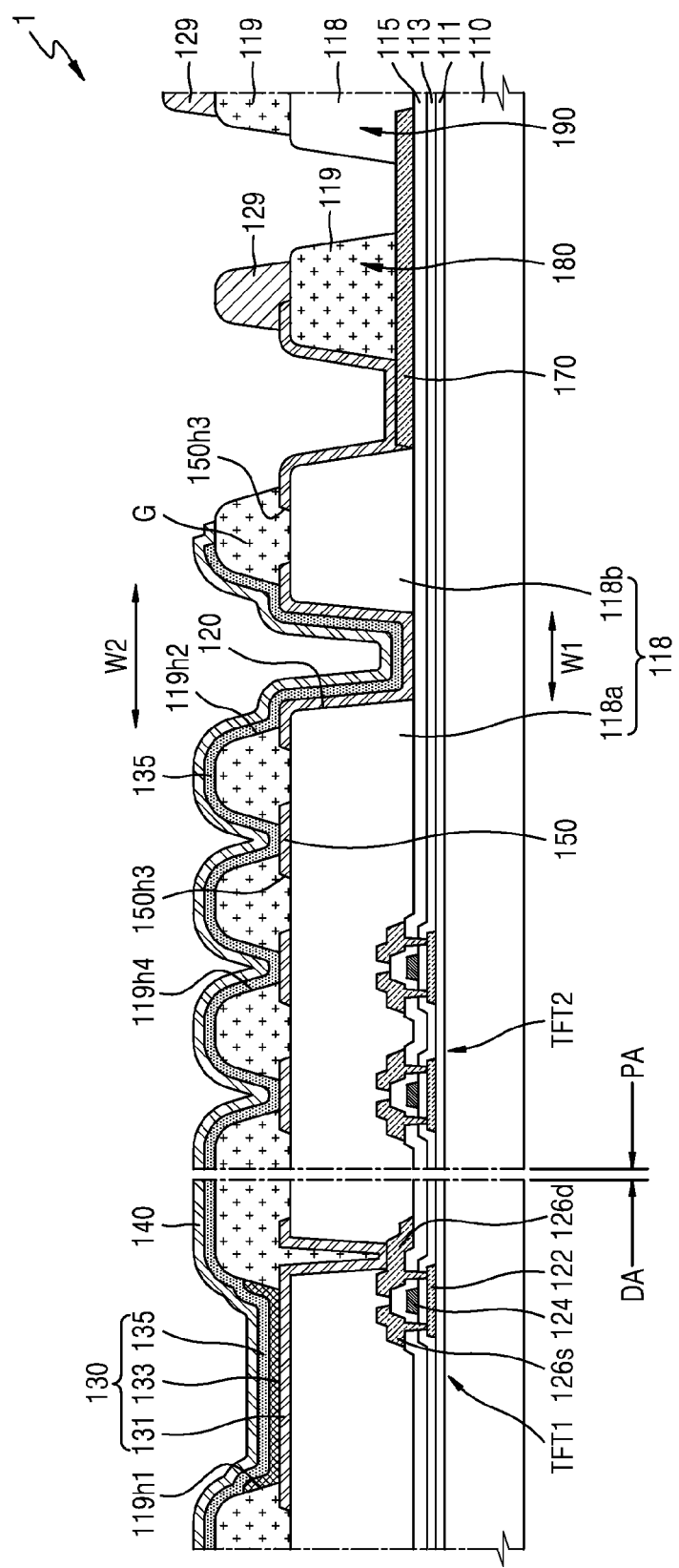
FIG. 2 is a schematic cross-sectional view illustrating a part of the organic light-emitting display apparatus taken along a line II-II of FIG. 1.
Figure 3:
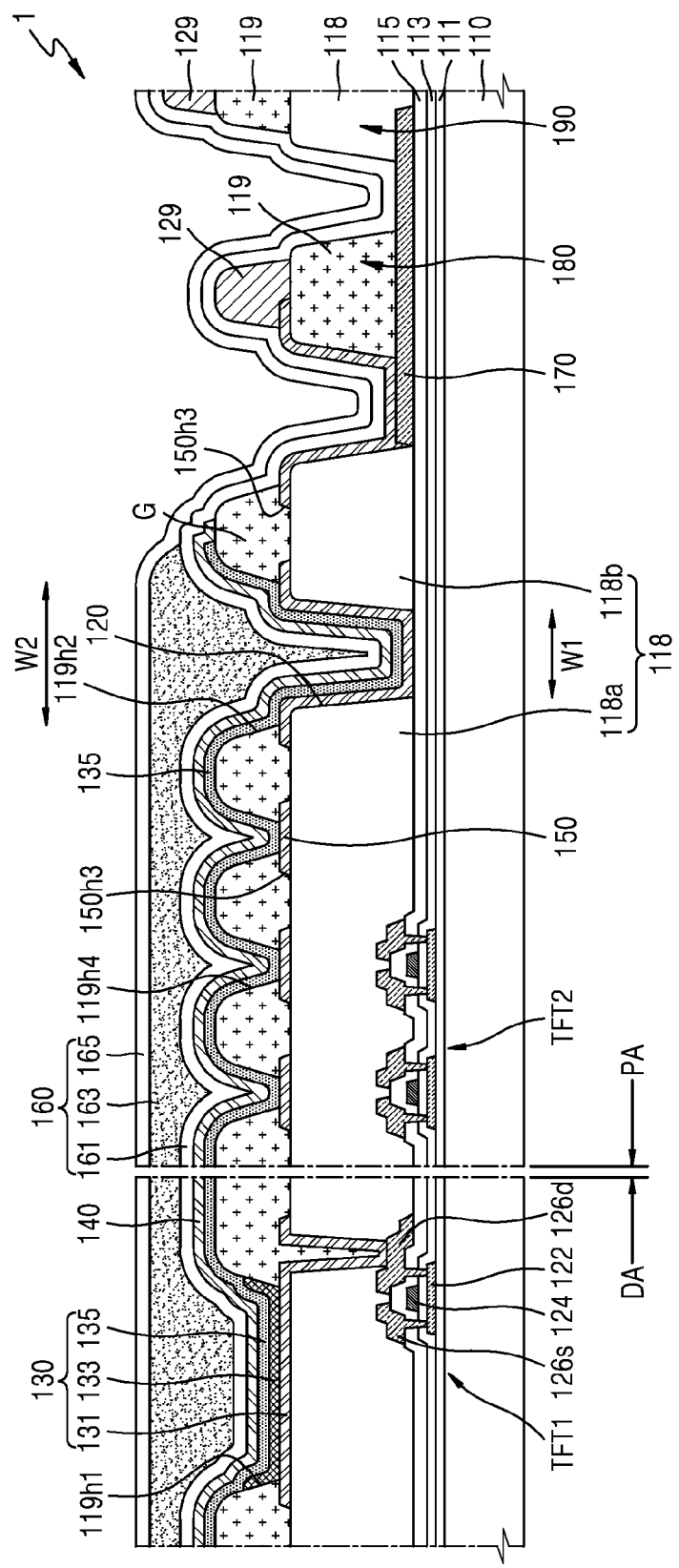
FIG. 3 is a cross-sectional view illustrating a structure in which an encapsulation member is formed in the organic light-emitting display apparatus of FIG. 2.

FIG. 1 is a schematic plan view illustrating a part of an organic light-emitting display apparatus 1, according to an exemplary embodiment of the present disclosure, FIG. 2 is a schematic cross-sectional view illustrating a part of the organic light-emitting display apparatus 1 taken along a line II-II of FIG. 1, and FIG. 3 is a cross-sectional view illustrating a structure in which an encapsulation member 160 is formed in the organic light-emitting display apparatus 1 of FIG. 2.

Referring to FIGS. 1 through 3, the organic light-emitting display apparatus 1 according to an exemplary embodiment of the present disclosure includes a substrate 110 having a display area DA and a periphery area PA (e.g., a non-display area), that is alongside or outside of the display area DA. A valley portion 120 separates a first organic insulating layer 118. The first organic insulating layer 118 operates as a planarization film and is formed outside of the display area DA. A second organic insulating layer 119 is formed of a same material as a pixel-defining layer. The second organic insulating layer 119 may include a second opening 119h2 in the valley portion 120. A second electrode 135 (e.g., a common electrode) is disposed in the valley portion 120. The second electrode 135 may cover the valley portion 120. A capping layer 140 may cover the second electrode 135.

A structure of the second electrode 135 and the capping layer 140, formed around the valley portion 120, may prevent impurities, such as a gas or moisture generated from an organic material included in the organic light-emitting display apparatus 1, from infiltrating into the organic light-emitting display apparatus 1.

The substrate 110 may be formed of a glass material, a metal material, and/or a plastic material. For example, the substrate 110 may be a flexible substrate including a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and or cellulose acetate propionate (CAP).

The display area DA is an area where an image is displayed, and a plurality of first thin-film transistors TFT1 and a plurality of organic light-emitting devices (OLEDs) 130 that are electrically connected to the plurality of first thin-film transistors TFT1 may be disposed in the display area DA.

A buffer layer 111, including an inorganic material such as silicon oxide (SiO), silicon nitride (SiN) and/or oxynitride (SiON), may be disposed between the first thin-film transistor TFT1 and the substrate 110. The buffer layer 111 may increase flatness of a top surface of the substrate 110, and/or may prevent or reduce infiltration of impurities into a semiconductor layer 122 through the substrate 110.

The first thin-film transistor TFT1 may include the semiconductor layer 122, a gate electrode 124, a source electrode 126s, and a drain electrode 126d, wherein the semiconductor layer 122 includes amorphous silicon, polycrystalline silicon, and/or an organic semiconductor material.

The gate electrode 124 is disposed above the semiconductor layer 122. The source electrode 126s and the drain electrode 126d electrically communicate with each other according. to a signal applied to the gate electrode 124. The gate electrode 124 may include a single layer or may have a multilayer structure including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), while considering adhesion with an adjacent layer, and surface flatness and processibility of a stacked layer.

To obtain insulation between the semiconductor layer 122 and the gate electrode 124, a gate insulating film 113 may be disposed between the semiconductor layer 122 and the gate electrode 124. The gate insulating film 113 may include an inorganic material such as SiO, SiN, and/or SiON.

An interlayer insulating film 115 including, an inorganic material, such as SiO, SiN, and/or SiON, may be disposed above the gate electrode 124. The source and drain electrodes 126s and 126d may each be disposed over the interlayer insulating film 115. The source and drain electrodes 126s and 126d may each be electrically connected to the semiconductor layer 122 through a contact hole formed in the interlayer insulating film 115 and the gate insulating film 113.

The source and drain electrodes 126s and 126d may each include a single layer or may each have a multilayer structure including Al, Pt, Pd, Ag, Mg, Au, Ni, Nd, Ir, Cr, Li, Ca, Mo, Ti, W, and/or Cu.

A second thin-film transistor TFT2 may be disposed in the periphery area PA of the substrate 110. The second thin-film transistor TFT2 may be a part of a circuit unit for controlling an electric signal applied in the display area DA.

The second thin-film transistor TFT2 may have the same structure as the first thin-film transistor TFT1 described above. Alternatively, the second thin-film transistor TFT2 may have a different structure from the first thin-film transistor TFT1.

The second thin-film transistor TFT2 may be formed of the same material as the first thin-film transistor TFT1. For example, the second thin-film transistor TFT2 may include a semiconductor layer including amorphous silicon, polycrystalline silicon, or an organic semiconductor material. Alternatively, the second thin-film transistor TFT2 may be formed of a different material from the first thin-film transistor TFT1.

The first organic insulating layer 118 may be disposed over the first thin-film transistor TFT1. When the OLED 130 is disposed above the first thin-film transistor TFT1, the first organic insulating layer 118 may operate as a planarization film such that a first electrode 131 is formed flat above the first organic insulating layer 118. The first organic insulating layer 118 may be formed of an organic material, such as, acryl, benzocyclobutene (BCB), PI, or hexamethyldisiloxane (HMDSO). In FIG. 2, the first organic insulating layer 118 includes a single layer, but may alternatively have a multilayer structure.

The first organic insulating layer 118 is formed in both the display area DA and the periphery area PA. The first organic insulating layer 118 includes the valley portion 120 that physically separates the first organic insulating layer 118 into first and second regions 118a and 118b, in the periphery area PA. The valley portion 120 forms an inorganic film cliff so as to block impurities, such as gas G or moisture, from contaminating the display area DA through the first organic insulating layer 118.

In the display area DA, the OLEO 130 includes the first electrode 131, the second electrode 135, and an intermediate layer 133. The intermediate layer 133 may include an emission layer and may be disposed between the first and second electrodes 131 and 135. The intermediate layer 133 may be disposed over the first organic insulating layer 118.

The first electrode 131 may be a transparent electrode or a reflective electrode. When the first electrode 131 is a transparent electrode, the first electrode 131 may include a transparent conductive layer.

The transparent conductive layer may include indium tin oxide (ITO), indium zinc oxide (IZO), zinc oxide (ZnO), indium oxide ($In_2O_3$), indium gallium oxide (IGO), and/or aluminum zinc oxide (AZO). The first electrode 131 may further include a semi-transmission layer for increasing light efficiency, in addition to the transparent conductive layer. The semi-transmission layer may include a thin film of Ag, Mg, Al, Pt, Pd, Au, Ni, Nd, Ir, Cr, Li, Ca, and/or YB and may have a thickness of between 2 nm and 144 nm.

When the first electrode 131 is a reflective electrode, the first electrode 131 may include a reflective film formed of Ag, Mg, Al, Pt, Pd, Au, Ni, Nd, Ir, Cr, or a compound thereof, and a transparent conductive layer disposed above and/or below the reflective film. The transparent conductive layer may include ITO, IZO, ZnO, $In_2O_3$, IGO, and/or AZO.

However, the first electrode 131 is not limited thereto, and may include various other materials, and may have any one of various structures, such as a single layer structure or a multilayer structure.

The second organic insulating layer 119 may be disposed over the first organic insulating layer 118, throughout the display area DA and the periphery area PA.

An opening 119$h$1 of the second organic insulating layer 119 exposing a center portion of the first electrode 131 defines a pixel. The second organic insulating layer 119 may cover an edge of the first electrode 131 to prevent an arc of electricity from being generated at the edge of the first electrode 131.

The second organic insulating layer 119 may be formed of an organic material, such as PI or HMDSO. The second organic insulating layer 119 may be formed of the same material or a different material as the first organic insulating layer 118.

The second organic insulating layer 119 includes the second opening 119$h$2 exposing the valley portion 120 formed in, the first organic insulating layer 118, in the periphery area PA. Like the valley portion 120 formed in the first organic insulating layer 118, the second opening 119$h$2 forms an organic film cliff; thereby blocking impurities, such as the gas G or moisture, from infiltrating into the display area DA through the second organic insulating layer 119.

The intermediate layer 133 of the OLED 130 may include a low molecular weight or polymer material.

When the intermediate layer 133 includes a low molecular weight material, the intermediate layer 133 may have a structure in which a hole injection layer (HIL), a hole transport layer (HTL), an emission layer (EML), an electron transport layer (ETL), and an electron injection layer (EIL) are stacked on each other in a single-layer or a multi-layer structure. The intermediate layer 133 may include copper phthalocyanine (CuPc) N,N'-di(naphthalene-1-yl)-N,N'-diphenyl-benzidine (NPB), and/or tris-8-hydroxyquinoline aluminum (Alq3). The intermediate layer 133 may be formed by various methods, such as a vacuum deposition method.

When the intermediate layer 133 includes a polymer material, the intermediate layer 133 may include an HTL and an EML. Here, the HTL may include PEDOT, and the EML may include a poly-phenylenevinylene (PPV)-based polymer material or a polyfluorene-based polymer material. The intermediate layer 133 may be formed by various methods, such as a screen printing method, an inkjet printing method, or a laser-induced thermal imaging (LITI) method.

The intermediate layer 133 may include a layer integrated throughout the plurality of first electrodes 131, or may include a layer patterned according to each of the plurality of first electrodes 131.

The second electrode 135 is formed throughout the display area DA and the periphery area PA. The second electrode 135 may be disposed above the intermediate layer 133 and the second organic insulating layer 119, inside of the second opening 119$h$2 of the second organic insulating layer 119, and inside of the valley portion 120 of the first organic insulating layer 118. The second electrode 135 may form a common electrode by being integrally formed with the plurality of OLEDs 130.

The second electrode 135 may be a transparent electrode or a reflective electrode.

When the second electrode 135 is a transparent electrode, the second electrode 135 may include Ag, Al, Mg, Li, Ca, Cu, LiF/Ca, LiF/Al, and/or CaAg, and have a form of a thin film having a thickness of 2 nm to 144 nm.

When the second electrode 135 is a reflective electrode, the second electrode 135 may include Ag, Al, Mg, Li, Ca, Cu, LiF/Ca, LiF/Al, MgAg, and/or CaAg. However, a structure and material of the second electrode 135 are not limited thereto, and may vary.

The capping layer 140 may be disposed above the second electrode 135. The capping layer 140 may protect a light-emitting device and may increase light generating efficiency.

The capping layer 140 may include a plurality of layers, such as a layer increasing light efficiency and a layer protecting a light-emitting device. For example, the capping layer 140 may include, in order to increase light efficiency, one or more organic or inorganic materials, such SiO, SiN, $ZnO_2$, $TiO_2$, $ZrO_2$, ITO, IZO, Alq3, CuPc, CBP, a-NPB, and/or $ZiO_2$. According to an exemplary embodiment of the present disclosure, the capping layer 140 may generate a Plasmon resonance phenomenon with respect to light generated by the OLED 130. For example, the capping layer 140 may include nano-particles.

The capping layer 140 may prevent the OLED 130 from being damaged by heat or plasma generated during a chemical vapor deposition (CVD) process or a sputtering process performed to form the encapsulation member 160. For example, the capping layer 140 may include an epoxy-based material including bisphenol-type epoxy resin, epoxidized butadiene resin, fluorine-type epoxy resin, and/or novolac epoxy resin.

The capping layer 140 may have a larger area than that of the second electrode 135 such that an end of the second electrode 135 is covered. When the CVD process or sputtering process for forming the encapsulation member 160 is performed while the capping layer 140 is not covering the end of the second electrode 135, it may be difficult to prevent oxidization of the second electrode 135.

The capping layer 140 including the organic material may be a passage for diffusing moisture or a gas inside the organic light-emitting display apparatus 1. However, according to an exemplary embodiment of the present disclosure, the second electrode 135 passes the display area DA and extends in a direction towards the outside of the organic light-emitting display apparatus 1 up to the valley portion 120 formed in the first organic insulating layer 118, and extends up to the second opening 119$h$2 formed in the second organic insulating layer 119 outside of the valley portion 120. Accordingly, the second electrode 135 blocks the gas or moisture generated from the first or second organic insulating layer 118 or 119, and thus diffusion of impurities by the capping layer may be prevented.

Figure 4:
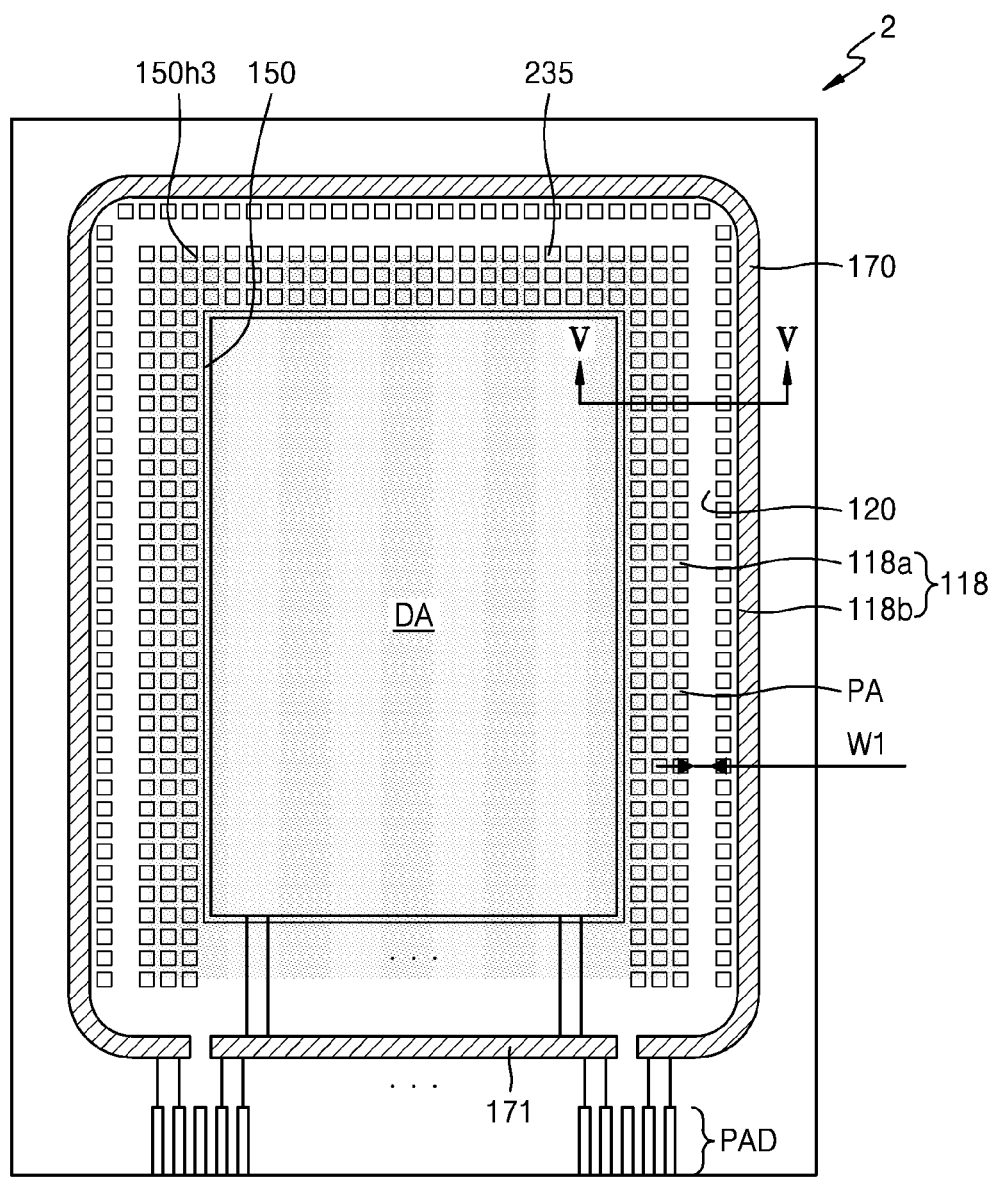
FIG. 4 is a schematic plan view illustrating a part of an organic light-emitting display apparatus.
Figure 5:
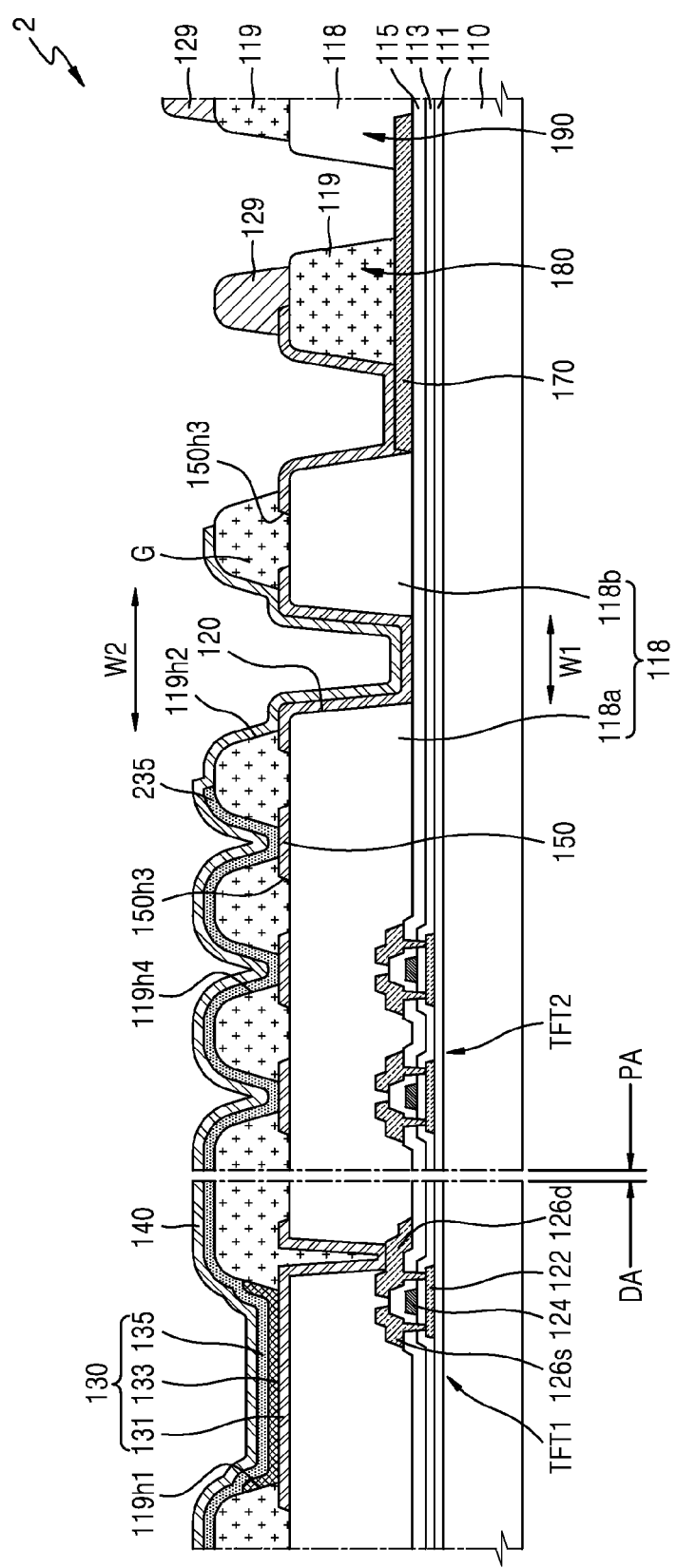
FIG. 5 is a schematic cross-sectional view illustrating a part of the organic light-emitting display apparatus taken along a line V-V of FIG. 4.

FIG. 4 is a schematic plan view illustrating a part of an organic light-emitting display apparatus 2, according to an exemplary embodiment of the present invention, and FIG. 5 is a schematic cross-sectional view of a part of the organic light-emitting display apparatus 2 taken along a line V-V of FIG. 4.

In drawings, like reference numerals may denote like elements, and to the extent that elements of the organic light-emitting display apparatus 2 is not described herein, it may be assumed that these non-described elements are at least similar to corresponding elements described with respect to the organic light-emitting display apparatus 1.

Referring to FIGS. 4 and 5, in the organic light-emitting display apparatus 2, a second electrode 235 is disposed inside of the valley portion 120 that faces the display area DA.

In the organic light-emitting display apparatus 2, the first organic insulating layer 118 includes the valley portion 120. The valley portion 120 physically separates the first organic insulating layer 118 into first and second regions 118a and 118b, in the periphery area PA. The valley portion 120 forms an organic film cliff so as to prevent impurities, such as the gas G or moisture, from being transmitted through the first organic insulating layer 118.

The second organic insulating layer 119 includes the second opening 119h2 exposing the valley portion 120 formed in the first organic insulating layer 118, in the periphery area PA. The second opening 119h2 forms the organic film cliff like the valley portion 120 formed in the first organic insulating layer 118 so as to prevent transmission of impurities, such as the gas G or moisture, through the second organic insulating layer 119.

However, in this example, the second electrode 235, e.g., a common electrode, is disposed inside of the valley portion 120 facing the display area DA. The capping layer 140 covers the second electrode 235. When the capping layer 140 is disposed outside of the valley portion 120, the gas G diffused through the first or second organic insulating layer 118 or 119 is not blocked by the second electrode 235, but may be diffused along the capping layer 140 including an organic material. The gas G diffused along the capping layer 140 is transmitted to the first and second organic insulating layer 118 and 119 inside of the valley portion 120. The impurities, such as the gas G or moisture, transmitted as such may cause deterioration of the OLED 130 of the display area DA.

However, in this embodiment, since the second electrode 135 (see FIG. 2) extends up to the valley portion 120 formed in the first organic insulating layer 118 in a direction towards the outside of the organic light-emitting display apparatus 1, and extends up to the second opening 119h2 of the second organic insulating layer 119 outside of the valley portion 120, it would be difficult for the gas of the first or second organic insulating layer 118 or 119 to be diffused through the capping layer 140. Even if the gas diffuses through the capping layer 140, the OLED 130 is covered by the second electrode 135, and thus deterioration of the OLED 130 may be prevented.

Referring back to FIGS. 1 through 3, a first power supply line 170 and a second power supply line 171, which supply power to the OLED 130, are disposed outside of the valley portion 120 of the periphery area PA.

The first power supply line 170 may be a low voltage power source. The first power supply line 170 is connected to the second electrode 135 through a connection conductive layer 150 to apply low voltage power to the OLED 130.

The first power supply line 170 may surround the display area DA. In the current embodiment, the first power supply line 170 surrounds the display area DA in a shape of "U", but the invention is not limited to this particular arrangement. The first power supply line 170 may be formed on any side of the display area DA.

The second power supply line 171 may be a high voltage power source. The second power supply line 171 is directly connected to the display area DA and may apply high voltage power to the OLED 130.

The OLED 130 may be connected to an external power supply apparatus through a pad unit PAD connected to the first and second power supply lines 170 and 171. The connection conductive line 150 may be disposed above the first organic insulating layer 118 and inside of the valley portion 120, in the periphery area PA. The connection conductive line 150 is disposed on the same layer as the first electrode 131, and at least a part of the connection conductive line 150 may be disposed between the first and second organic insulating layers 118 and 119. The connection conductive line 150 may be formed of the same material as the first electrode 131, and may completely cover the valley portion 120.

According to an exemplary embodiment of the present disclosure, the connection conductive line 150 includes a plurality of third openings 150h3 disposed around the valley portion 120. The second organic insulating layer 119 may include a fourth opening 119h4 exposing at least a part of the connection conductive line 150.

The second organic insulating layer 119 may be separated into a plurality of regions by the fourth opening 119h4. The third openings 150h3 included in the connection conductive line 150 may operate as paths for externally discharging a gas generated from the first organic insulating layer 118 formed of an organic material below the connection conductive line 150. Accordingly, infiltration of the gas generated from the first organic insulating layer 118 into the display area DA may be prevented, and thus deterioration of quality of an image realized by the organic light-emitting display apparatus 1 may be prevented or reduced.

The fourth opening 119h4 of the second organic insulating layer 119 may expose the connection conductive line 150. The second electrode 135 disposed over the second organic insulating layer 119 may contact the connection conductive line 150 through the fourth opening 119h4. The connection conductive line 150 is connected to the first power supply line 170 supplying power to the second electrode 135.

The valley portion 120 formed in the first organic insulating layer 118 may surround the display area DA. In the current exemplary embodiment of the present disclosure, the valley portion 120 surrounds the display area DA in a shape of "U", but the invention is not limited to this particular configuration. The first organic insulating layer 118 may be physically and spatially separated into the first and second regions 118a and 118b by the valley portion 120. Similarly, the second organic insulating layer 119 may be separated into at least two regions by the second opening 119h2 that is located to correspond to the valley portion 120.

A width W2 of the second opening 119h2 included in the second organic insulating layer 119 may be larger than a width W1 of the valley portion 120 included in the first organic insulating layer 118. Accordingly, the second organic insulating layer 119 might not be provided in the valley portion 120.

The connection conductive line 150 may also surround the display area DA in the periphery area PA, and cover the valley portion 120. The connection conductive line 150 may include the plurality of third openings 150h3 disposed around the valley portion 120.

The second electrode 135 is provided throughout the display area DA and the periphery area PA, and may completely cover the valley portion 120. The second electrode 135 may directly contact the connection conductive line 150 in the valley portion 120.

A part of the connection conductive line 150 may completely cover the valley portion 120 while another part of the connection conductive line 150 is disposed between the first and second organic insulating layers 118 and 119. Alternatively, the connection conductive line 150 may cover a part of the valley portion 120. However, the connection conductive line 150 may cover at least a part of the valley portion 120 throughout a region surrounding the display area DA.

Referring to FIG. 3, the encapsulation member 160 may include at least one inorganic film and at least one organic film. For example, an organic film may be disposed over the capping layer 140.

The encapsulation member 160 may cover the display area DA and may extend up to the periphery area PA. As shown in FIG. 3, the encapsulation member 160 may include a first inorganic layer 161, an organic layer 163, and a second inorganic layer 165.

The first inorganic layer 161 may cover the capping layer 140 and may include SiO, SiN, and/or SiON. A layer including Lit may be disposed between the first inorganic layer 161 and the capping layer 140.

Since the first inorganic layer 161 is formed above a structure, a top surface of the first inorganic layer 161 might not be flat. The organic layer 163 may cover the first inorganic layer 161 that is not flat, and a top surface of the organic layer 163 may be more flat than the first inorganic layer 161. The organic layer 163 may include PET, PEN, PC, PI, polyethylene sulfonate, polyoxymethylene polyarylate, PAR, and/or HMDSO.

The second inorganic layer 165 covers the organic layer 163 and may include SiN, SiN, and/or SiON. The second inorganic layer 165 may contact the first inorganic layer 161 at an edge region of the organic light-emitting display apparatus 1 such that the organic layer 163 is not exposed outside of the organic light-emitting display apparatus 1.

As such, the encapsulation member 160 may include the first inorganic layer 161, the organic layer 163, and the second inorganic layer 165. Accordingly. even when the encapsulation member 160 is cracked, cracks are not connected between the first inorganic layer 161 and the organic layer 163 or between the organic layer 163 and the second inorganic layer 165. Accordingly, external moisture or oxygen may be prevented or reduced from being infiltrated into the display area D.

A first dam portion 180 and a second dam portion 190 are disposed outside of the first and second power supply lines 170 and 171. Although not shown in FIG. 1, the first and second dam portions 180 and 190 may surround the display area DA.

The first and second dam portions 180 and 190 prevent the organic layer 163 from leaking to the periphery area PA.

The first dam portion 180 may have a structure in which the second organic insulating layer 119 and a spacer 129 are stacked on each other. However, the present invention is not limited to this particular arrangement, and the first dam portion 180 may be formed of different materials and may have different heights from the second organic insulating layer 119 and spacer 129. For example, the first dam portion 180 may have a structure in which the first and second organic insulating layers 118 and 119 are stacked on each other.

The second dam portion 190 may have a structure in which the first organic insulating layer 118, the second organic insulating layer 119, and the spacer 129 are stacked on each other. However, the present invention is not limited to this particular arrangement, and the second dam portion 190 may be formed of different materials and have different heights from the first insulating layer 118, the second organic insulating layers 119, and the spacer 129.

The first organic insulating layer 118 of the second dam portion 190 may cover an end of the first power supply line 170 so as to prevent deterioration of the first power supply line 170 during backplane manufacture that uses heat or chemicals.

The second dam portion 190 not only prevents the organic layer 163 from leaking into the periphery area PA, but also prevents a metal mask from stamping a surface of the second electrode 135 while the metal mask is used.

The spacer 129 may prevent the metal mask from stamping the surface of the second electrode 135 while the metal mask is used during manufacture of the encapsulation member 160. The spacer 129 may be formed in a part of the display area DA and periphery area DA.

FIGS. 6 through 9 are schematic plan views illustrating various modified designs of the valley portion 120, the second electrode 135, and the capping layer 140 formed in the first organic insulating layer 118 with respect to the organic light-emitting display apparatus 1, according to exemplary embodiments of the present disclosure.

Figure 6:
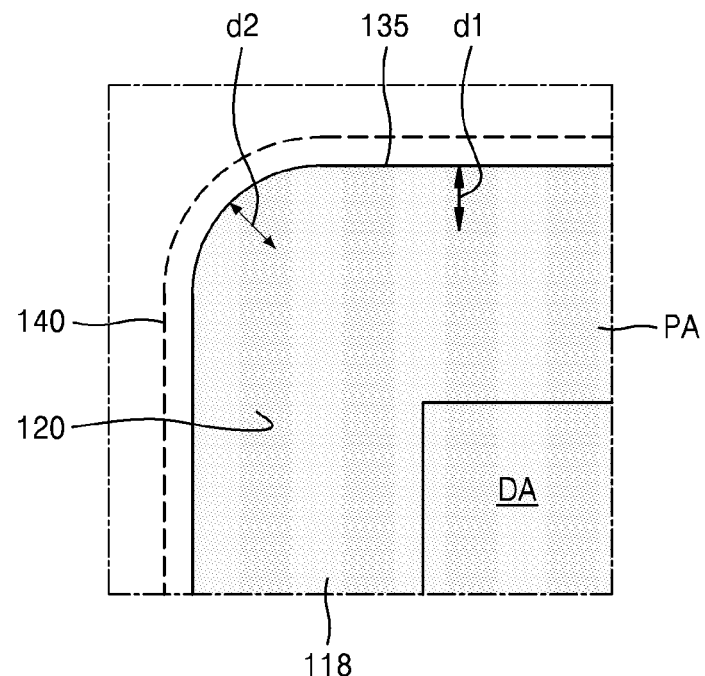
FIGS. 6 through 9 are schematic plan views illustrating various modified designs of a valley portion, a second electrode, and a capping layer formed in a first organic insulating layer with respect to an organic light-emitting display apparatus, according to exemplary embodiments of the present disclosure.

Referring to FIG. 6, a corner of the valley portion 120 may be round. The second electrode 135 may completely cover the valley portion 120 and the capping layer 140 may completely cover the second electrode 135.

A distance d2 between the end of the second electrode 135 and the valley portion 120 in a region corresponding to the corner of the display area DA is equal to a distance d1 between the end of the second electrode 135 and the valley portion 120 in a remaining region, e.g., a region corresponding to one side of the display area DA.

Figure 7:
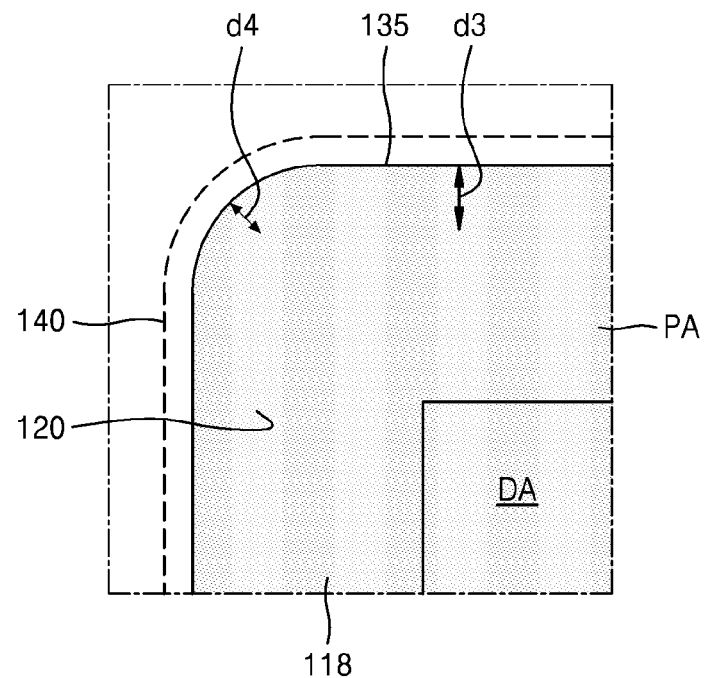

Referring to FIG. 7, the corner of the valley portion 120 may be orthogonal. The second electrode 135 may completely cover the valley portion 120 and the capping layer 140 may completely cover the second electrode 135.

A distance d4 between the end of the second electrode 135 and the valley portion 120 in the region corresponding to the corner of the display area DA may be smaller than a distance d3 between the end of the second electrode 135 and the valley portion 120 in the remaining region, e.g., the region corresponding to one side of the display area DA.

Figure 8:
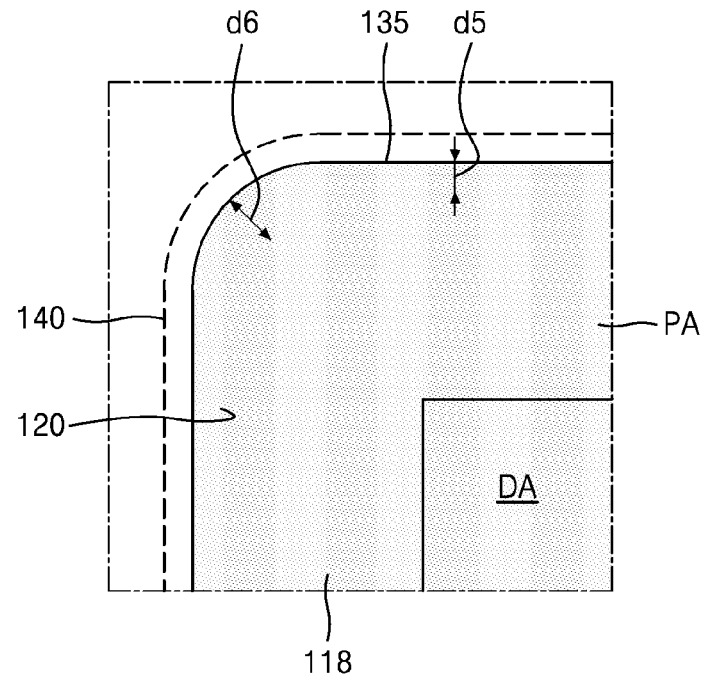

Referring to FIG. 8, the corner of the valley portion 120 may be concave. For example, the valley portion 120 may include a region concave in a shape of "L" at the corner. The second electrode 135 completely covers the valley portion 120 and the capping layer 140 completely covers the second electrode 135.

A distance d6 between the end of the second electrode 135 and the valley portion 120 in the region corresponding to the corner of the display area DA may be smaller than a distance d5 between the end of the second electrode 135 and the valley portion 120 in the remaining region, e.g., the region corresponding to one side of the display area DA.

Figure 9:
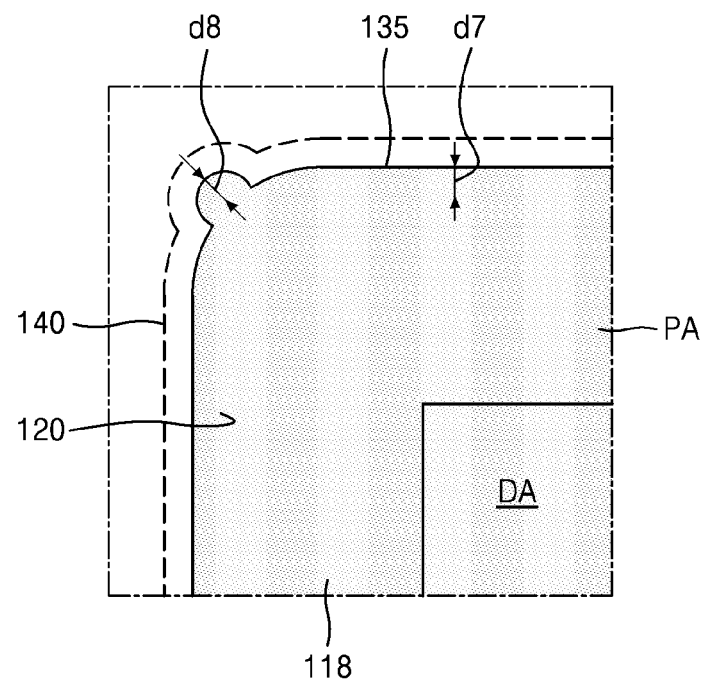

Referring to FIG. 9, the valley portion 120 may include a region in which the second electrode 135 protrudes farther from the display area DA. This region may be disposed at the corner. The second electrode 135 completely covers the valley portion 120 and the capping layer 140 completely covers the second electrode 135.

A distance d8 between the end of the second electrode 135 and the valley portion 120 in the region corresponding to the corner of the display area DA may be smaller than or larger than a distance d7 between the end of the second electrode 135 and the valley portion 120 in the remaining region, e.g., the region corresponding to one side of the display area DA.

According to the design of FIGS. 6 through 9, an area of the second electrode 135 may be optimized. Also, by optimizing the area of the second electrode 135, an area of the capping layer 140 completely covering the second electrode 135 may be optimized. By optimizing the areas of the second electrode 135 and the capping layer 140, amounts of materials being used may be reduced or a design of the periphery area PA may be optimized.

Figure 10:
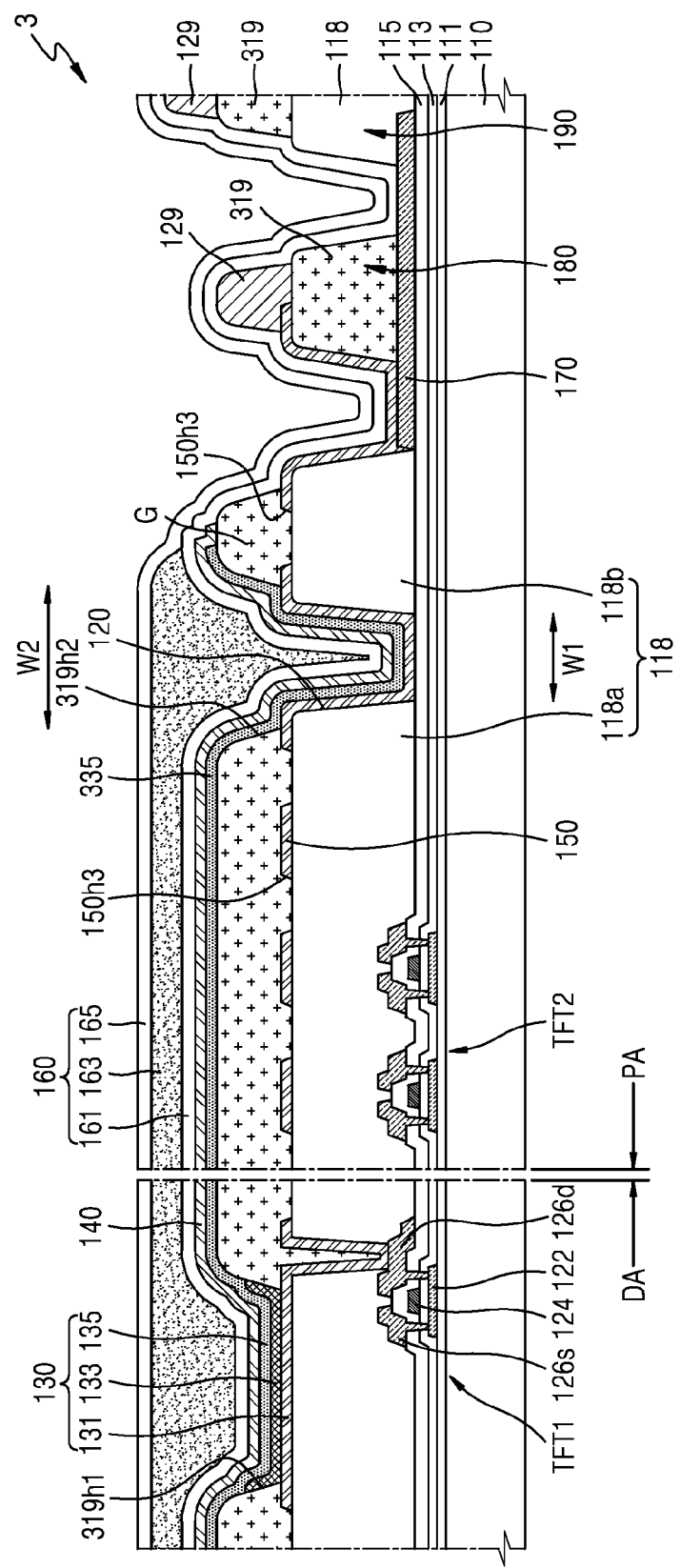
FIG. 10 is a schematic plan view illustrating a part of an organic light-emitting display apparatus, according to another embodiment.

FIG. 10 is a schematic plan view of a part of an organic light-emitting display apparatus 3, according to an exemplary embodiment of the present disclosure.

The organic light-emitting display apparatus 3 of FIG. 10 is different from the organic light-emitting display apparatus 1 of FIG. 3 in structures of a second organic insulating layer 319 and second electrode 335.

The second organic insulating layer 319 does not include an opening exposing the top surface of the connection conductive line 150 (see the fourth opening 119h4 of FIG. 2), unlike the organic light-emitting display apparatus 1 of FIG. 3. Accordingly, the second electrode 335 does not contact the connection conductive line 150 through the opening formed in the second organic insulating layer 319. When the opening is formed in the second organic insulating layer 319, a gas generated by the second organic insulating layer 319 is discharged through the opening before the second electrode 335 is formed, but a patterning process of forming the opening would be performed. Accordingly, in the configuration illustrated in FIG. 10, as diffusion prevention is not obtained and the patterning process is omitted.

Figure 11:
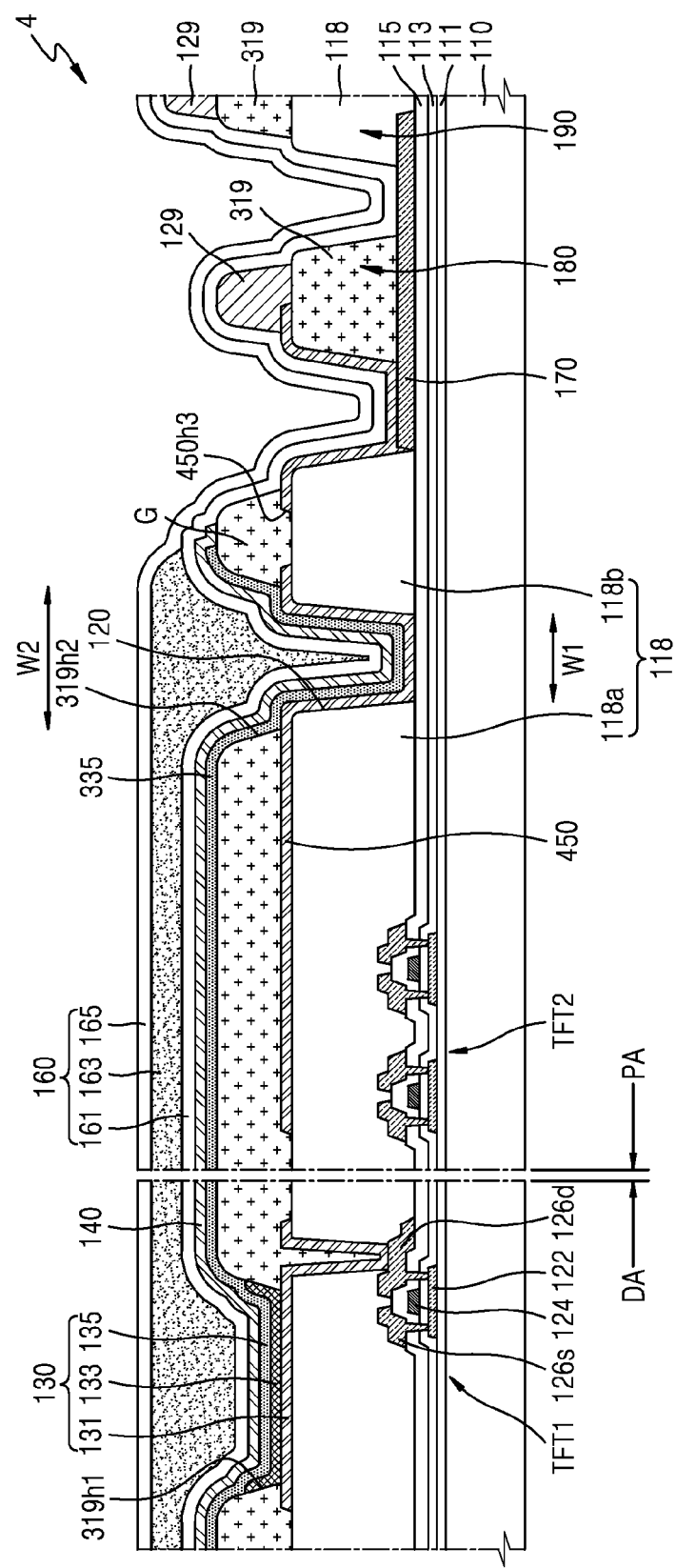
FIG. 11 is a schematic plan view illustrating a part of an organic light-emitting display apparatus, according to an exemplary embodiment of the present disclosure.

FIG. 11 is a schematic plan view illustrating a part of an organic light-emitting display apparatus 4, according to an exemplary embodiment of the present disclosure. The organic light-emitting display apparatus 4 of FIG. 11 is different from the organic light-emitting display apparatus 3 of FIG. 10 in a structure of a connection conductive layer 450.

Since a patterning process of forming an opening (see the third opening 150h3 of FIG. 10) in the connection conductive layer 450 is not performed, the organic light-emitting display apparatus 4 may be manufactured via simpler processes than the organic light-emitting display apparatus 3 of FIG. 10.

In the organic light-emitting display apparatuses 1, 3, and 4, as described above, a valley portion, e.g., an organic film cliff, is formed in a first organic insulating layer in a periphery area. A second electrode, e.g., a common electrode, is disposed outside of the valley portion, thereby preventing diffusion of impurities. Also, a capping layer may be formed larger than the second electrode to completely cover the second electrode, so as to prevent oxidization of the second electrode while an encapsulation member is formed.

According exemplary embodiments of the present invention, an organic light-emitting display apparatus capable of preventing or reducing deterioration of quality of an image during manufacture or in use may be realized.

While one or more embodiments have been described with reference to the figures, it will be understood by those of ordinary skill in the art that various changes in form and details may be made therein without departing from the spirit and scope of the present disclosure.

What is claimed is:

1. An organic light-emitting display apparatus comprising:
   a substrate having a display area, within which an image is displayed using a plurality of organic light-emitting devices;
   a valley portion disposed on the substrate outside of the display area, the valley portion separating a region of an organic insulating layer;
   a power supply line disposed on the substrate outside of the display area and supplying power to the plurality of organic light-emitting devices;
   a dam portion disposed on the substrate outside of the display area;
   a common electrode of the plurality of organic light-emitting devices, covering the display area and the valley portion, and contacting the power supply line;
   a capping layer covering the common electrode; and
   an encapsulation member disposed over the capping layer and comprising at least one organic film and at least one inorganic film.

2. The organic light-emitting display apparatus of claim 1, further comprising a connection conductive layer disposed outside of the display area and connecting the common electrode and the power supply line.

3. The organic light-emitting display apparatus of claim 1, wherein the at least one organic film of the encapsulation member is disposed in the display area and inside of the dam portion.

4. The organic light-emitting display apparatus of claim 1, wherein the at least one inorganic film of the encapsulation member covers the display area and the dam portion, and extends outside of the dam portion.

5. The inorganic light-emitting display apparatus of claim 1, wherein the dam portion comprises a first dam portion and a second dam portion disposed outside of the first dam portion.

* * * * *